United States Patent
Seippel et al.

(10) Patent No.: US 7,433,667 B2
(45) Date of Patent: Oct. 7, 2008

(54) SIGNAL CONDITIONING CIRCUIT

(75) Inventors: Dietolf Seippel, Bottrop (DE); André Hanke, Düsseldorf (DE); Duyen Pham-Stäbner, Ratingen (DE)

(73) Assignee: Infineon Technologies AG, Munich (DE)

( * ) Notice: Subject to any disclaimer, the term of this patent is extended or adjusted under 35 U.S.C. 154(b) by 923 days.

(21) Appl. No.: 10/947,963

(22) Filed: Sep. 23, 2004

(65) Prior Publication Data

US 2005/0113056 A1    May 26, 2005

(30) Foreign Application Priority Data

Sep. 26, 2003    (DE)    ................. 103 44 851

(51) Int. Cl.
*H04B 1/26* (2006.01)

(52) U.S. Cl. .................. 455/313; 455/303; 455/334

(58) Field of Classification Search .......... 455/313–334
See application file for complete search history.

(56) References Cited

U.S. PATENT DOCUMENTS 6,785,528 B2 * 8/2004 Carpineto ................. 455/323

2006/0141972 A1 * 6/2006 Matsuno .................... 455/313

FOREIGN PATENT DOCUMENTS

DE    102 11 524 A1    5/2003
EP    0 594 403 B1    4/1994

OTHER PUBLICATIONS

Chapter 9 "Schaltwerke", Halbleiter-Schaltungstechnik, U. Tietze and Ch. Schenk, Springer Publishing, New York, 1991, 38 pgs.

* cited by examiner

*Primary Examiner*—Lana N. Le
*Assistant Examiner*—Ajibola Akinyemi
(74) *Attorney, Agent, or Firm*—Eschweiler & Associates LLC

(57) ABSTRACT

A signal conditioning circuit contains an oscillator which is connected to the inputs of two mixers. The output of one mixer is coupled, so as to form a feedback path, to a frequency divider circuit whose first output is coupled to the second input of the first mixer. A second signal output of the frequency divider circuit carries a signal with a phase shift of 90 degrees with respect to the signal at the first signal output of the frequency divider circuit. The second signal is supplied to a second input of the second mixer. Feedback results in undesirable signal components in the in-phase and quadrature components being suppressed. At the same time, the in-phase and quadrature components have a fixed phase relationship with respect to one another. The signal conditioning circuit allows desired non-integer division ratios to be achieved.

20 Claims, 2 Drawing Sheets

SIGNAL CONDITIONING CIRCUIT

REFERENCE TO RELATED APPLICATIONS

This application claims the benefit of the priority date of German application DE 103 44 851.9, filed on Sep. 26, 2003, the contents of which are herein incorporated by reference in their entirety.

FIELD OF THE INVENTION

The invention relates to a signal conditioning circuit for providing a complex output signal.

BACKGROUND OF THE INVENTION

Signal conditioning circuits are used, in particular, for vector modulators or for mixing received signals. The output driver may in this case be coupled to the vector modulator. A similar coupling problem also arises in the receiver path if the oscillator signal is fed back to the input of the receiver where it forms an additional, but undesirable, signal component. This additional signal component interferes with reception of the actual wanted signal. In this case, a cross-modulation product which occurs, in particular, when using a vector modulator has a particularly disruptive effect. Since, for the cross-modulation product to form, the frequency ratio between the output frequency and the oscillator frequency is usually even, it is expedient to select a non-integer ratio between the oscillator frequency and the output frequency. Potential options would be, for example: $f_{OSC}=4/3\ f_{out}$ or $f_{OSC}=3/2\ f_{out}$.

An in-phase component and a quadrature component also need to be additionally provided in order to use vector modulators, or indirect conversion receivers. Said components together form a complex signal. Division and subsequent mixing or an analog phase shifter have/has hitherto been used in a so-called 3/2 frequency concept to provide the in-phase and the quadrature phase as components of the oscillator signal.

FIG. 4 shows one known concept. In that case, an oscillator provides an output signal which is supplied to the inputs of two mixers. In addition, a frequency divider is used to divide the oscillator signal by three, and two components whose phases have been shifted through 90 degrees with respect to one another are produced. One of the two signals is respectively supplied to one of the two mixers as a second input signal. The output signals at the two mixers likewise have a phase shift of 90° and together form the complex output signal.

In this case, the frequency divider required is of extremely complex design. One known embodiment requires three differential master-slave D flip-flops and additional logic gates which operate at the output frequency. In the proposed frequency division concept, the accuracy of a phase shift between the output component I and the output component Q can be ensured only with great difficulty by means of an odd divider. Master-slave D flip-flops as frequency divider circuits are disclosed, inter alia, in Tietze/Schenk, "Halbleiterschaltungstechnik" [Semiconductor circuit technology], Springer Verlag, 12th edition, Chapter 9, pages 675 to 709.

Another variant for producing an output signal at a frequency which is 2/3 the oscillator signal frequency again involves dividing the frequency of the oscillator signal by a factor of three and then using the two mixers to convert it to the output frequency. An analog phase shifter which is connected to the output of one of the two mixers then produces the phase shift of 90 degrees between the two output signals. The disadvantage of a concept such as this is that an analog phase shifter usually has a very low impedance. A high driver power from a preamplifier is thus required, which in turn increases the power consumption. The analog variances in the process additionally lead to losses in the phase accuracy between the in-phase and the quadrature component.

Document DE 102 11 524 discloses a circuit arrangement which uses feedback to produce an output signal at a frequency which is 2/3 the oscillator signal frequency. In this case, production of the output signal is restricted to just this frequency ratio.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

According to one or more aspects of the present invention, a signal conditioning circuit is provided that is operative to produce a complex signal having an in-phase component and a quadrature component, with the effect of the oscillator signal on the output being lessened.

According to one or more aspects of the present invention, a signal conditioning circuit comprises an oscillator for producing a signal at a first frequency. The signal conditioning circuit furthermore contains a first frequency conversion device and a second frequency conversion device, each of which has a first input and a second input. The first and second frequency conversion devices are designed to convert a first signal at a first frequency at the first input and a second signal at a second frequency at the second input to a third signal at a third frequency. The third signal is provided at respective outputs of the frequency conversion devices, which form outputs of the signal conditioning circuit. The first input of the first frequency conversion device is connected to the oscillator. The first input of the second conversion device is also coupled to the oscillator. The signal conditioning circuit contains a frequency divider circuit whose signal input is coupled to the output of the first frequency conversion device so as to form a feedback path. The frequency divider circuit has a first signal output (which is connected to the second input of the first conversion device) and furthermore contains a second signal output which is coupled to the second signal input of the second conversion device. The frequency divider circuit is designed to provide, at the first signal output, a first signal with a first phase and at a frequency which has been divided, with respect to the frequency of a signal applied to its input, by the division ratio of the frequency divider circuit. The frequency divider arrangement is thus designed to use the division ratio to divide the frequency of a signal applied to the signal input and uses said frequency to produce an output signal which it emits at the first signal output. The frequency divider circuit is further designed to provide, at the second signal output, a second signal at the divided frequency and with a second phase which has been shifted through 90 degrees with respect to the first phase of the signal. The frequency divider circuit thus provides two signals which are at the same frequency and have a phase shift of 90 degrees with respect to one another.

The signal conditioning circuit facilitates an improved production of a complex output signal having an in-phase component and the quadrature component. The frequency divider arrangement provides two signals which are orthogonal to one another and are used as input signals for the frequency conversion devices. The two output signals from the signal conditioning circuit are therefore orthogonal to one another as well. Feedback considerably improves the phase accuracy of the signals produced. At the same time, feedback facilitates suppression of undesirable components in the output signal and, in particular, decouples the oscillator's input signal from the output signal. Feedback results in the output signal from the conversion device having the phase relationship of the input signal.

The circuit according to one or more aspects of the present invention may, in particular, advantageously be used in transmitter devices and receiving devices for vector modulators or direct conversion receivers.

Unlike conventional signal conditioning circuits, the circuit according to one or more aspects of the present invention is designed for difference signal processing. Interference on lines is thus reduced, in particular. In a refinement such as this, the frequency divider circuit may likewise be implemented in a particularly simple manner using a flip-flop circuit. In one particularly preferred refinement of the invention, the frequency divider circuit is in the form of a master-slave D flip-flop. This has the advantage that it oscillates freely which excites the inventive oscillator arrangement on its own. The circuit is excited, with the aid of feedback, at the ideal frequency and thus reliably starts to oscillate. The flip-flop is designed so that undesirable spectral components in the output signal are additionally suppressed by the flip-flop's greater attenuation or poorer resonant response.

In one example, the master-slave D flip-flop is designed for frequency division by even division ratios. As such, the flip-flop produces, in a simple manner, two output signals which have a phase shift of 90 degrees with respect to one another. This advantageously mitigates variations due to process fluctuations, thus enhancing production quality. The signals provided by the master-slave D flip-flop may be fed directly to the respective second input of the frequency conversion devices.

In another example, a filter device is provided in the feedback path between the signal input of the frequency divider circuit and the signal output of the first conversion device. The filter device suppresses undesirable spectral components in the output signal, so that signals at undesired frequencies are not fed to the frequency divider circuit. This considerably improves the transient response.

In another example, the frequency divider circuit comprises a phase shifter circuit for providing the second signal. The phase shifter circuit is designed to supply the first signal to the frequency divider circuit and to provide, at the second signal output, the second signal, whose phase has been shifted through 90 degrees with respect to the first phase of the first signal.

BRIEF DESCRIPTION OF THE DRAWINGS

The invention is explained in more detail below using a plurality of exemplary embodiments and with reference to the drawings, in which.

DETAILED DESCRIPTION OF THE INVENTION

Figure 1:
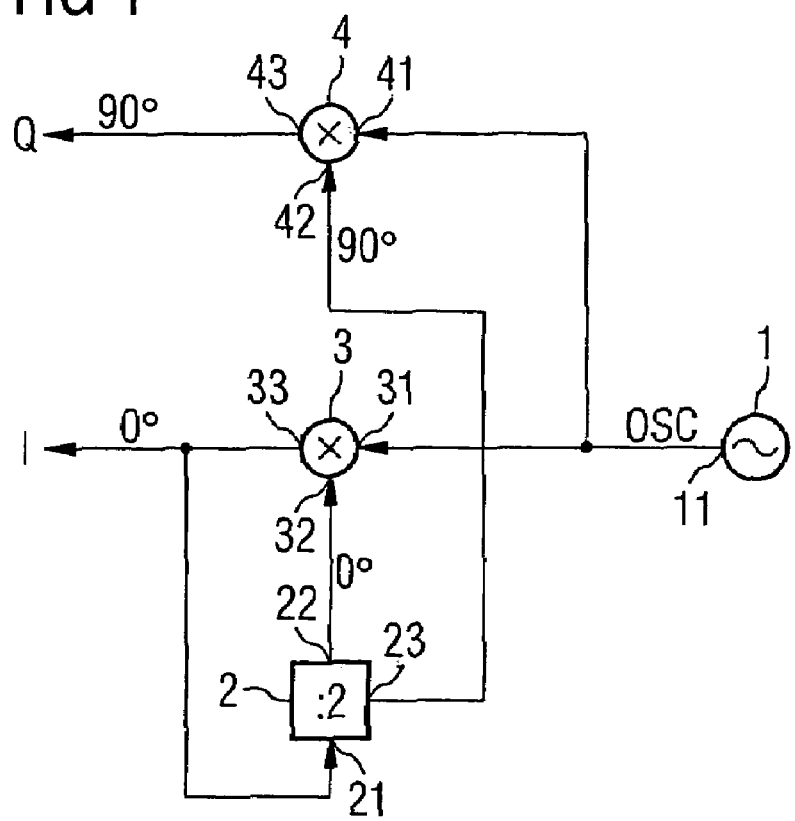
FIG. 1 is a circuit schematic illustrating an exemplary signal conditioning circuit according to one or more aspects of the present invention.

The present invention pertains to a signal conditioning circuit. One or more aspects of the present invention will now be described with reference to drawing figures, wherein like reference numerals are used to refer to like elements throughout. It should be understood that the drawing figures and following descriptions are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details. Thus, it will be appreciated that variations of the illustrated systems and methods apart from those illustrated and described herein may exist and that such variations are deemed as falling within the scope of the present invention and the appended claims.

Turning to FIG. 1, a schematic diagram illustrates an exemplary signal conditioning circuit designed for difference signal processing according to one or more aspects of the present invention. A produced difference signal has two signal elements which are of the same magnitude but have different mathematical signs. The difference between the two signal elements is therefore always the same. Difference signal processing has the advantage that interference usually becomes evident in the same manner in both signal elements, so that the difference between the signal elements remains unchanged.

The signal conditioning circuit contains a voltage-controlled oscillator 1 which emits an oscillator signal OSC at its output 11. The oscillator output 11 of the oscillator 1 is connected to a first input of a first mixer 3 and to a first input 41 of a second mixer 4. An output 33 of the first mixer 3 carries the in-phase component I. An output 43 of the second mixer 4 carries the quadrature component Q. The phase of the quadrature component Q has been shifted through 90 degrees with respect to the in-phase component I. The outputs 33 and 43 of the two mixers 3 and 4 simultaneously form the outputs of the signal conditioning circuit.

A local oscillator arrangement furthermore contains a frequency divider circuit 2. The input 21 of the latter is connected to the output 33 of the first mixer 3. The frequency divider circuit contains a first output 22—which is connected to a second input 32 of the first mixer 3—and a second output 23 which is connected to a second input 42 of the second mixer 4.

The frequency divider circuit 2 has a division ratio of 2 to 1 and thus divides the frequency of an input signal and produces, at the output, a signal at half the frequency of the input signal. The frequency divider circuit may be in the form of a master D flip-flop, for example, and is designed for difference signal processing. Said flip-flop produces two output signals which are each at half the frequency of the input signal and have a phase shift of 90° with respect to one another. The output signal at the output 22 of the frequency divider circuit 2 therefore has a first phase, and the output signal at the second output 23 of the frequency divider circuit 2 has a phase which has been shifted through 90 degrees with respect to the first signal.

The local oscillator arrangement described here has, to a first approximation, two frequencies for its output signals I and Q. The two output frequencies are determined from the mixing concept of the mixer 3. When the first-order mixing terms are taken into account, the output frequency $f_{OUT}$ of the output signal I firstly results as a sum of the frequency of the oscillator signal OSC and half the output frequency $f_{OUT}$ at the output of the mixer 3:

$$f_{OUT1} = f_{OSC} + \tfrac{1}{2} f_{OUT1}$$

The second possible first-order mixing term is the difference between the oscillator frequency and half the output frequency:

$$f_{OUT2} = f_{OSC} - \tfrac{1}{2} f_{OUT2}$$

This results in the following for a first output frequency $f_{OUT}$ of the output signal:

$$f_{OUT1} = \tfrac{2}{3} f_{OSC} \text{ or } f_{OUT1} = 2 f_{OSC}$$

Figure 2:
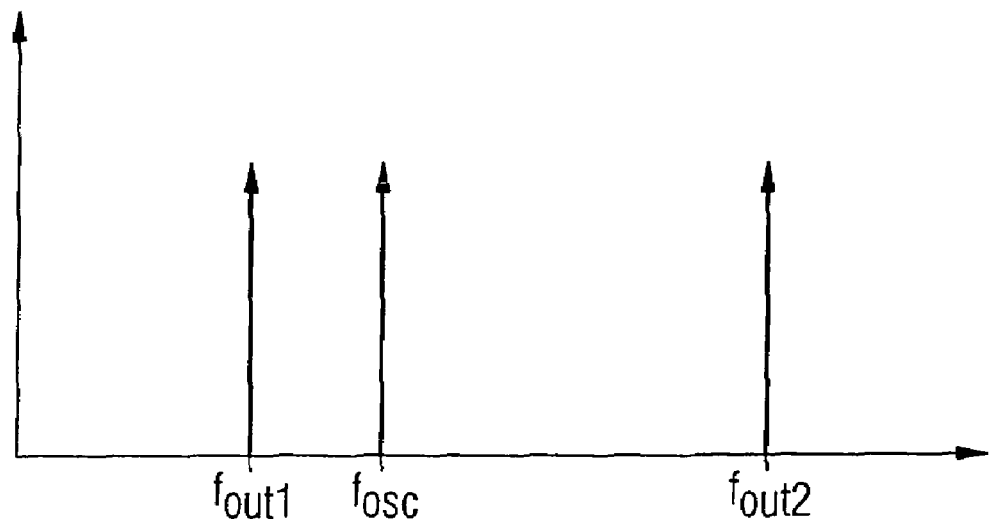
FIG. 2 is a graphical depiction of a frequency spectrum whereon one or more frequencies that can be produced in accordance with one or more aspects of the present invention are illustrated.

The two possible frequencies for the output signal I are therefore 2 GHz and 6 GHz for an oscillator frequency of 3 GHz. This is sketched in FIG. 2.

Suitably designing the flip-flop makes it possible for one of the two possible frequencies $f_{OUT1}$ or $f_{OUT2}$ to be suppressed, so that the entire circuit oscillates at one frequency. In this case, merely a lower gain or greater attenuation in a frequency range in which one of the two frequencies lies is usually sufficient. If the mixer produces further combination frequencies, these may likewise be selected by suitable prefiltering. In this case, output signals at frequencies outside the desired frequency range are suppressed. The flip-flop's self-oscillation facilitates oscillation of the system.

In the illustrated example in FIG. 1, the master-slave flip-flop also produces an output signal which has been shifted through 90 degrees. Said signal is used as the input signal for the second mixer 4. However, the frequency conversion operation in the mixers 3 and 4 results in a phase shift being retained. The two signals at the outputs of the mixers thus also have the same phase shift.

Figure 3:
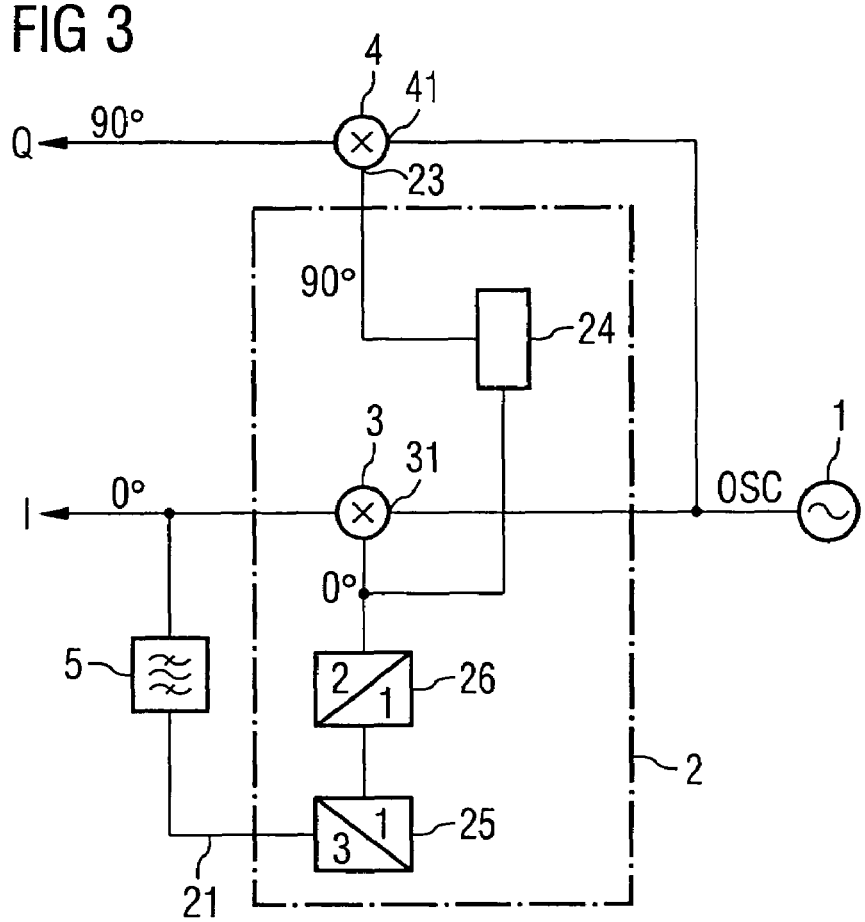
FIG. 3 is a circuit schematic illustrating another exemplary signal conditioning circuit according to one or more aspects of the present invention.
Figure 4:
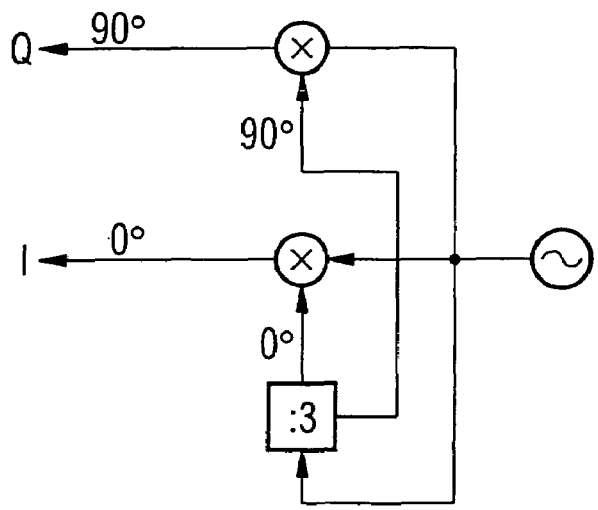
FIG. 4 is a circuit schematic illustrating a conventional signal conditioning circuit.

It will be appreciated that the frequency divider circuit may be expanded in order to produce more complex frequency ratios between the input signal $f_{OSC}$ and the output signal I or Q according to one or more aspects of the present invention. FIG. 3 illustrates an exemplary circuit arrangement that facilitates such ratios, wherein like components bear like reference symbols to those depicted in FIG. 1.

In FIG. 3, the frequency divider circuit 2 contains a first frequency divider 25, a multiplier 26 and a phase shifter 24. The input 21 of the frequency divider circuit 2 is connected to the input of the frequency divider 25. The latter has a division ratio of 3:1 and thus divides the frequency of the input signal by a factor of 3 and emits an output signal at a frequency which is one third the input frequency. The output signal is supplied to a multiplier 26 which doubles the frequency. The division ratios of the frequency divider 25 and of the multiplier 26 are indicated in FIG. 3. The output signal which has been produced in this manner is therefore at a frequency which is ⅔ the frequency of the signal applied to the input 21.

The output signal is supplied to the second input of the first mixer 3 and additionally to a phase shifter 24. The latter shifts the phase of the input signal, so that a signal at the same frequency but with a phase which has been shifted through 90 degrees is produced at the output. This signal is supplied to the second input of the second mixer 4. Dividing the frequency of the input signal by a factor of 3 and then multiplying it by a factor of 2 thus allows an output signal to be produced whose frequency corresponds either to three times the oscillator frequency $f_{OSC}$ or to the value ⅔ $f_{OSC}$.

In addition, the output of the mixer 3 is connected to a bandpass filter 5, which filters the output signal at a frequency of ⅔ $f_{OSC}$. This deters the oscillator arrangement from oscillating at three times the oscillator frequency. A low-pass filter or a high-pass filter may also be used instead of the bandpass filter.

It will be appreciated that the examples described herein are not meant to be restrictive. In principle, feedback allows any desired frequency to be set for the output signals I and Q, given a suitable choice of frequency divider. If flip-flop circuits having an even division ratio are used, it is possible to concurrently use the flip-flops to produce the signals which have been shifted through 90° with respect to one another. Said signals may be fed directly to the mixers. A sigma-delta modulator may also be used instead of the circuit shown in FIG. 3 to produce fractional division ratios in a simple manner.

At the same time, the signals which have been produced in this manner have a phase shift of substantially 90 degrees with respect to one another. In particular, the phase relationship between the signal I and the signal Q is retained, since the output signal from the mixer 3 has the phase relationship of the input signal at the second input. A signal conditioning circuit such as this may be used, for example, for a vector modulator or for a demodulator which requires a complex input signal having the components I and Q.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising." Also, exemplary is merely intended to mean an example, rather than the best.

The invention claimed is:

1. A signal conditioning circuit for providing a complex output signal having a first component (I or $f_{OUT1}$) at a first tap and a second component (Q or $f_{OUT2}$) at a second tap, comprising:

an oscillator circuit for providing a signal at a first frequency ($f_{OSC}$);

a first conversion device, comprising:
    a first input operatively coupled to the oscillator circuit,
    a second input, and
    an output which forms the first tap of the signal conditioning circuit,
        with the first conversion device converting the frequency of signals applied to its inputs to an output signal;

a second conversion device, comprising:
  a first input operatively coupled to the oscillator circuit,
  a second input, and
  an output which forms the second tap of the signal conditioning circuit,
    with the second conversion device converting the frequency of signals applied to its inputs to an output signal; and
a frequency divider circuit, comprising:
  a sigma-delta modulator having a division ratio associated therewith for producing signals using fractional division ratios,
  a signal input that is operatively coupled to the output of the first conversion device so as to form a feedback path, wherein a filter device is provided in the feedback path,
  a first signal output operatively coupled to the second input of the first conversion device and providing a first signal with a first phase and at a first frequency which is a function of the frequency of a signal applied to the signal input of the frequency divider circuit and the division ratio of the frequency divider circuit, and
  a second signal output operatively coupled to the second input of the second conversion device and providing a second signal at the frequency of the first signal and with a second phase which has been shifted through one or more degrees with respect to the first phase of the first signal.

2. The signal conditioning circuit of claim 1, wherein the frequency divider circuit comprises at least one master-slave D flip-flop.

3. The signal conditioning circuit of claim 2, wherein the filter device comprises a filter having at least one of a bandpass, low-pass and high-pass filter characteristic.

4. The signal conditioning circuit of claim 3, wherein the frequency divider circuit further comprises:
  a phase shifter circuit operatively coupled to the first signal output and operative to provide, at the second signal output, the second signal with the phase that has been shifted with respect to the first phase of the first signal.

5. The signal conditioning circuit of claim 1, wherein the second phase of the second signal is shifted 90° with respect to the first phase of the first signal.

6. The signal conditioning circuit of claim 1, wherein the division ratio is 2 to 1.

7. The signal conditioning circuit of claim 1, wherein the oscillator circuit comprises a voltage controlled oscillator.

8. The signal conditioning circuit of claim 1, wherein $f_{OUT1} = f_{OSC} + \frac{1}{2} f_{OUT1}$.

9. The signal conditioning circuit of claim 1, wherein $f_{OUT2} = f_{OSC} - \frac{1}{2} f_{OUT2}$.

10. The signal conditioning circuit of claim 1, wherein $f_{OUT1} = \frac{2}{3} f_{OSC}$ or $f_{OUT1} = 2 f_{OSC}$.

11. A signal conditioning circuit for providing a complex output signal having a first component (I or $f_{OUT1}$) at a first tap and a second component (Q or $f_{OUT2}$) at a second tap, comprising:
  an oscillator circuit for providing a signal at a first frequency ($f_{OSC}$);
  a first conversion device, comprising:
    a first input operatively coupled to the oscillator circuit,
    a second input, and
    an output which forms the first tap of the signal conditioning circuit,
      with the first conversion device converting the frequency of signals applied to its inputs to an output signal;
  a second conversion device, comprising:
    a first input operatively coupled to the oscillator circuit,
    a second input, and
    an output which forms the second tap of the signal conditioning circuit,
      with the second conversion device converting the frequency of signals applied to its inputs to an output signal; and
  a frequency divider circuit having a division ratio associated therewith, comprising:
    a signal input that is operatively coupled to the output of the first conversion device so as to form a feedback path,
    a first signal output operatively coupled to the second input of the first conversion device and providing a first signal with a first phase and at a first frequency which is a function of the frequency of a signal applied to the signal input of the frequency divider circuit and the division ratio of the frequency divider circuit, and
    a second signal output operatively coupled to the second input of the second conversion device and providing a second signal at the frequency of the first signal and with a second phase which has been shifted through one or more degrees with respect to the first phase of the first signal.

12. The signal conditioning circuit of claim 11, wherein the second phase of the second signal is shifted 90° with respect to the first phase of the first signal.

13. The signal conditioning circuit of claim 11, further comprising a filter device in the feedback path.

14. The signal conditioning circuit of claim 11, wherein the division ratio is 2 to 1.

15. A signal conditioning circuit for providing a complex output signal having a first component (I or $f_{OUT1}$) at a first tap and a second component (Q or $f_{OUT2}$) at a second tap, comprising:
  an oscillator circuit for providing a signal at a first frequency ($f_{OSC}$);
  a first conversion device, comprising:
    a first input operatively coupled to the oscillator circuit,
    a second input, and
    an output which forms the first tap of the signal conditioning circuit,
      with the first conversion device converting the frequency of signals applied to its inputs to an output signal;
  a second conversion device, comprising:
    a first input operatively coupled to the oscillator circuit,
    a second input, and
    an output which forms the second tap of the signal conditioning circuit,
      with the second conversion device converting the frequency of signals applied to its inputs to an output signal; and
  a frequency divider circuit, comprising:
    a first frequency divider having a first division ratio, comprising:
      a signal input operatively coupled to the output of the first conversion device so as to form a feedback path, and
      a signal output operatively coupled to a signal input of the multiplier and providing a first signal with a first phase and at a first frequency which is a function of a frequency of a signal applied to the signal input of the frequency divider and the first division ratio of the frequency divider, a multiplier having a second division ratio, comprising:

an output operatively coupled to the second input of the first conversion device and providing the second signal with the first phase and at a second frequency which is a function of the first frequency of the first signal applied to the signal input of the multiplier and the second division ratio of the multiplier, and a phase shifter, comprising:

a signal input operatively coupled to the output of the multiplier, and an output operatively coupled to the second input of the second conversion device and operative to provide a third signal at the second frequency of the second signal and with a second phase which has been shifted through one or more degrees with respect to the first phase of the second signal.

16. The signal conditioning circuit of claim 15, wherein the second phase of the third signal is shifted 90° with respect to the first phase of the second signal.

17. The signal conditioning circuit of claim 15, further comprising a filter device in the feedback path.

18. The signal conditioning circuit of claim 17, wherein the filter filters at a frequency of $3/5$ ($f_{OSC}$).

19. The signal conditioning circuit of claim 15, wherein the first division ratio of the first frequency divider divides by a factor of 3.

20. The signal conditioning circuit of claim 15, wherein the second division ratio of the multiplier multiplies by a factor of 2.

* * * * *